United States Patent [19]

Murakami et al.

[11] Patent Number: 4,602,730
[45] Date of Patent: Jul. 29, 1986

[54] DEVICE FOR SOLDERING PRINTED BOARD

[76] Inventors: Shuichi Murakami, 47-5, Yamanoue 5-chome,, Hirakata-shi, Osaka-fu 573; Chuichi Matsuda, 6-C48-103, Meitoku 1-chome, Neyagawa-shi, Osaka-fu 570; Tatsuya Matsumae, 354-5, Sunouchi Kou,, Saijo-shi, Ehime-ken 793; Kenichi Yamashita, 5-33, Nakanishi-cho,, Niihama-shi, Ehime-ken 792; Mikio Mori, 4602-11, Funaki Kou,, Niihama-shi, Ehime-ken 792, all of Japan

[21] Appl. No.: 619,146
[22] PCT Filed: Sep. 22, 1982
[86] PCT No.: PCT/JP82/00382
 § 371 Date: May 22, 1984
 § 102(e) Date: May 22, 1984
[87] PCT Pub. No.: WO84/01258
 PCT Pub. Date: Mar. 29, 1984

[51] Int. Cl.⁴ .................... B23K 1/06; B23K 3/06
[52] U.S. Cl. ........................ 228/37; 228/43; 228/56.1

[58] Field of Search ............... 228/180.1, 56.2, 56.1, 228/37, 43

[56] References Cited

U.S. PATENT DOCUMENTS

| 3,303,983 | 2/1967 | Patrick et al. ............ 228/180.1 |
| 3,993,236 | 11/1976 | Antonevich ............... 228/56.2 |
| 4,139,881 | 2/1979 | Shimizu et al. ........... 228/180.1 X |
| 4,465,219 | 8/1984 | Kondo ..................... 228/180.1 X |

FOREIGN PATENT DOCUMENTS

| 12378 | 5/1968 | Japan . |
| 122638 | 10/1975 | Japan . |
| 45703 | 10/1981 | Japan . |

Primary Examiner—Kenneth J. Ramsey
Attorney, Agent, or Firm—Wenderoth, Lind & Ponack

[57] ABSTRACT

Device for soldering a printed board, equipped with a printed substrate conveyor, which effects soldering of chip parts on a printed substrate by moving the printed substrate through a molten solder wave formed by providing a nozzle in a solder tank accommodating molten solder, and a vibration imparter for giving vibration to the printed substrate when it is passing through the molten solder wave.

4 Claims, 7 Drawing Figures

DEVICE FOR SOLDERING PRINTED BOARD

FIELD OF THE INVENTION

The present invention relates to a soldering device for soldering on a printed substrate and, particularly, pertains to a device for soldering chip form parts such as resistances and condensers, which have no leads carried on a printed substrate, on printed conductor portions of the substrate at opposite end electrodes thereof.

BACKGROUND ART

A soldering device for chip parts which has been available is a jetting soldering device adapted to make soldering by jetting up molten solder onto the surface to be soldered. FIG. 1 shows the commonest wave form of the jetted solder.

This soldering device involves the following problem:

As shown in FIG. 1, the solder wave 2 is being produced from a nozzle 1, while the printed substrate 4 carrying chip parts 3 is moving from left to right, as seen in this figure, but the solder wave 2 cannot enter into a space formed between the chip part 5 and the chip part 6, giving rise to a phenomenon (hereinafter called solderlessness) that no solder can be put on the electrodes 7 and 8 on the chip parts 5 and 6. Since the solder wave 2 can enter into the space between the chip parts 6 and 9 which are widely distanced from one another, solder will be deposited on their respective electrodes 10 and 11, forming solder paddings 12 and 13 on the circuit electrodes printed on the substrate 4. To correct the solderlessness which would develop in narrow spaces between chip parts, it is imperative to provide the solder paddings by manual operation, and local heating by the soldering iron used for the retouching has inflicted damage on these chip parts.

SUMMARY OF THE INVENTION

The present invention provides a printed substrate soldering device characterized by a contrivance by which vibrations are given to the printed substrate, as it passes through the aforementioned solder wave in the printed substrate soldering device. The device is equipped with a solder tank accommodating molten solder and a nozzle for producing a jetting of molten solder in the aforementioned solder tank, and which is adapted to make soldering on the printed substrate, while moving said substrate through the aforementioned jetted solder wave.

DETAILED DESCRIPTION OF THE PREFERRED EMBODIMENTS

Figure 1:
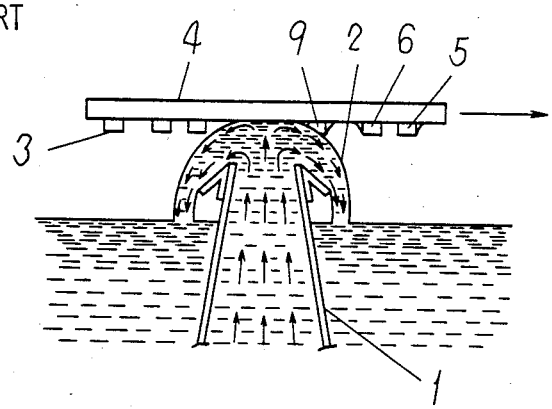
FIG. 1 is a schematic view of the conventional soldering device.
Figure 2:
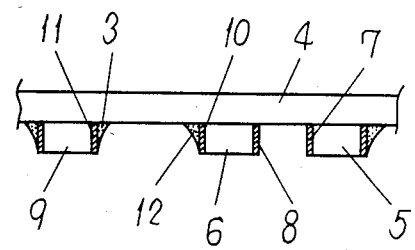
FIG. 2 is a side view of the principal portion of the printed substrate, showing the solderlessness in the conventional soldering device.
Figure 3:
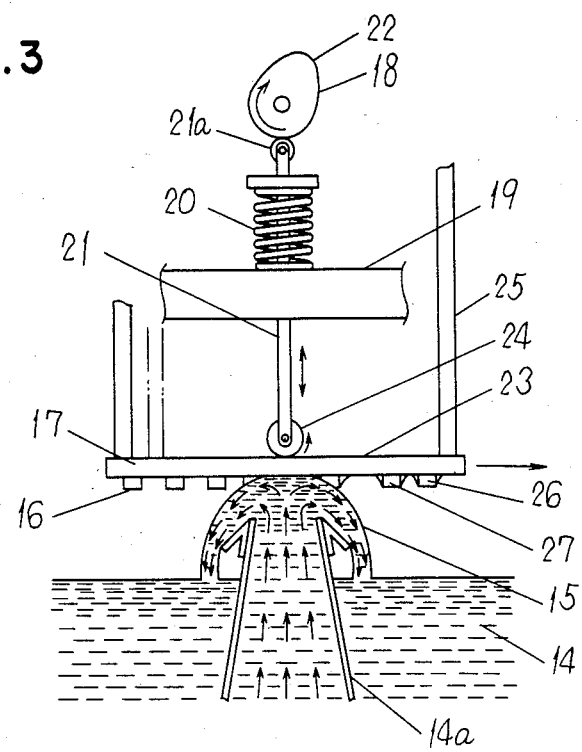
FIG. 3 is a side view showing the major arrangement of a soldering device embodying this invention.
Figure 4:
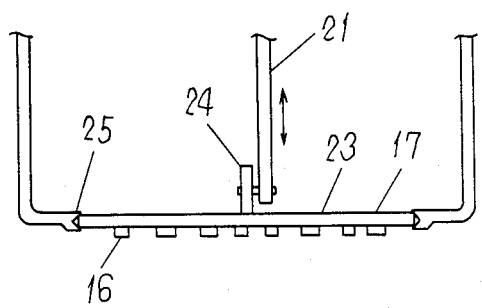
FIG. 4 is a front view of the principal portion of the arrangement shown in FIG. 3.
Figure 5:
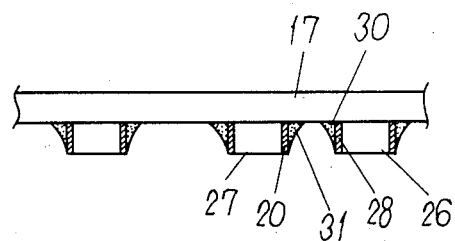
FIG. 5 is a side view of the principal part of the printed substrate on which soldering has been made by use of this device.

The present invention will become more apparent from the following detailed description taken in connection with the accompanying drawings:

In the embodiment illustrated in FIG. 3, the solder wave 15 flows out of nozzle 14a inside the solder tank 14, while the printed substrate carrying chip parts 16 thereon is moving from left to right. On the other hand, upward of the printed substrate 17, there is provided a vibration imparting means in which an offset cam plate 18 turns and, then, the rod 21 which is normally being pulled upward by a spring 20 held in place on the fixed plate 19, is set to make up-down reciprocations through a roller 21a. The up-down motion of the rod 21 will be transmitted to the printed substrate 17 through a roller 24 which is normally in contact with the upper surface 23 of the printed substrate 17; as a result, the printed substrate 17 which is supported by a printed substrate conveying means 25 will be vertically vibrated. On the printed substrate 17 being vibrated in this way, the solder wave 15 will become more apt to enter into narrow spaces between chip parts, so that, as shown in FIG. 5, the solder wave 15 will enter into the space between the chip parts 26 and 27 carried on the printed substrate 17 at a narrow distance from one another, permitting the solder to be deposited on their respective electrodes 28 and 29, thereby forming paddings 30 and 31.

Figure 6:
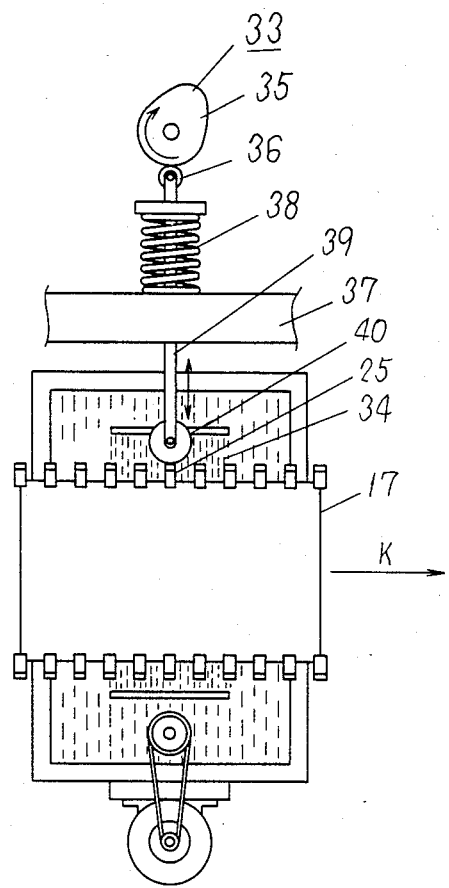
FIG. 6 is a plan view of the major arrangement of another soldering device embodying this invention.
Figure 7:
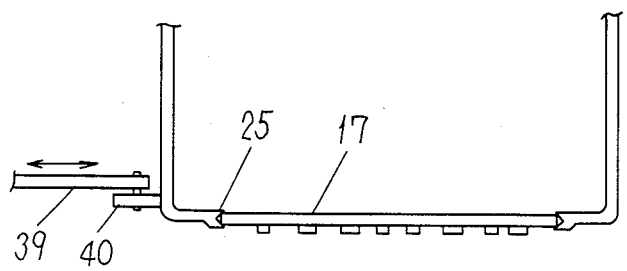
FIG. 7 is a front view of the principal portion of the arrangement shown in FIG. 6.

With regard to the way of giving vibration to the printed substrate 17, as shown in FIGS. 6 and 7, similar effect may be achieved by utilizing a vibration imparting means 33 which gives the impact on the side of the printed substrate 17. Thus, the turning of an offset cam 35 is transmitted through a roller 36 to a rod 39 to set it in fore and aft motion under the counterforce of a spring 38. When the printed substrate 17 is passing through the solder wave 34 in the direction indicated by an arrow K in FIG. 6, then, this motion is transmitted to the printed substrate 17 through a printed substrate conveying means 25 which is supporting the printed substrate 17 and, then, a roller 40, causing the printed substrate 17 to be vibrated from the side at a right angle to the conveying direction. In this way, a similar effect as that described in connection with the embodiment of FIG. 3 may be achieved.

In this embodiment, only one solder tank nozzle is used, but this invention is applicable to solder tanks having two or more nozzles. With such a device, the vibration should be given to the printed substrate when it passes through each of the nozzles and thereby similar effect is attainable.

Further, while in this embodiment, the printed substrate horizontally moves above the solder tank nozzle, a similar effect as in this embodiment is attainable, even when the printed substrate is moved obliquely to the horizontal.

As described in the foregoing, use of this invention makes feasible non-retouched soldering without causing solderlessness in making soldering on a printed substrate, particularly, a printed substrate carrying chip parts. Accordingly, not only the enormous labor required for retouch soldering is spared, but the chip parts are rescued from damage they would otherwise sustain from the retouching work. Thus, this invention's industrial value is quite appreciable.

It should be also noted that as a way of giving vibration to a printed substrate, turning of an offset cam is utilized in this embodiment, but other methods of giving vibration are applicable; for example, the method of using electromagentic coil or of using an air hammer, etc. Further, while in this embodiment, the vibration is given directly to the printed substrate, similar effect may be achieved by giving vibration to the carrier or pallet which is holding the printed substrate, causing vibration on the printed substrate.

What is claimed is:

1. A device for soldering on printed boards, comprising:
   means for conveying a printed board in a longitudinal direction;
   a solder tank for containing molten solder;
   nozzle means for jetting molten solder from said solder tank to form a molten solder wave which continuously contacts a bottom surface of the printed board as the printed board is conveyed by said conveying means;
   roller means for rollingly contacting one of the printed board and said conveying means as the printed board is conveyed by said conveying means; and
   means for imparting vibration through said roller means to the printed board as the printed board is conveyed by said conveying means with the molten solder wave in continuous contact with the bottom surface of the printed board.

2. A device for soldering on printed boards, comprising:
   means for conveying a printed board in a longitudinal direction;
   a solder tank for containing molten solder;
   nozzle means for jetting molten solder from said solder tank to form a molten solder wave which continuously contacts a bottom surface of the printed board as it is conveyed by said conveying means; and
   means for imparting vibration to the printed board as it is conveyed by said conveying means with the molten solder wave in continuous contact with the bottom surface of the printed board, said imparting means including a roller located to rollingly contact said conveying means as the printed board is conveyed by said conveying means with the molten solder wave in continuous contact with the bottom surface of the printed board and means for vibrating said roller generally perpendicular to said longitudinal direction so as to vibrate the printed board through said conveying means.

3. A device for applying solder to base portions of closely spaced, electrically conductive elements projecting from bottom surfaces of printed boards with open spaces between adjacent closely spaced ones of the elements, said device comprising:
   means for conveying a printed board in a longitudinal direction;
   a solder tank for containing molten solder;
   nozzle means for jetting molten solder from said solder tank to form a molten solder wave which continously contacts a bottom surface of the printed board as the printed board is conveyed by said conveying means;
   roller means for rollingly contacting one of the printed board and said conveying means as the printed board is conveyed by said conveying means; and
   means for imparting sufficient viration to the printed board through said roller means that the molten solder from the molten solder wave attaches to the bases of the elements, in the open spaces, as the printed board is conveyed by said conveying means with the molten solder wave in continuous contact with the bottom surface of the printed board.

4. A device as in claim 3, wherein said roller means includes a roller located to rollingly contact said conveying means as the printed board is conveyed by said conveying means with the molten solder wave in continuous contact with the bottom surface of the printed board, said imparting means including means for vibrating said roller generally perpendicularly to said longitudinal direction so as to vibrate the printed board through said conveying means.

* * * * *